United States Patent
Giacomini et al.

(10) Patent No.: US 10,254,418 B2
(45) Date of Patent: Apr. 9, 2019

(54) SEMICONDUCTOR DETECTOR, RADIATION DETECTOR AND RADIATION DETECTOR AND RADIATION DETECTION APPARATUS

(71) Applicant: HORIBA, Ltd., Kyoto-shi, Kyoto (JP)

(72) Inventors: Gabriele Giacomini, Trento (IT); Claudio Piemonte, Trento (IT); Daisuke Matsunaga, Kyoto (JP)

(73) Assignee: HORIBA, LTD., Kyoto (JP)

( * ) Notice: Subject to any disclaimer, the term of this patent is extended or adjusted under 35 U.S.C. 154(b) by 0 days.

(21) Appl. No.: 15/387,809

(22) Filed: Dec. 22, 2016

(65) Prior Publication Data

US 2017/0184732 A1   Jun. 29, 2017

(30) Foreign Application Priority Data

Dec. 24, 2015  (IT) .................. 102015000087721

(51) Int. Cl.
*G01T 1/24* (2006.01)
*H01L 31/0224* (2006.01)
(Continued)

(52) U.S. Cl.
CPC .......... *G01T 1/241* (2013.01); *G01R 29/0814* (2013.01); *G01T 1/247* (2013.01);
(Continued)

(58) Field of Classification Search
CPC ..... G01R 29/0814; G01T 1/241; G01T 1/247; H01L 31/022408; H01L 31/085; H01L 31/115
See application file for complete search history.

(56) References Cited

U.S. PATENT DOCUMENTS

| 4,885,620 A | * | 12/1989 | Kemmer | ............... H01L 27/148 |
| | | | | 250/330 |
| 4,951,106 A | * | 8/1990 | Blouke | ..................... G01J 3/26 |
| | | | | 257/222 |

(Continued)

FOREIGN PATENT DOCUMENTS

EP   2677345 A2   12/2013
JP   2014-002155 A   1/2014

OTHER PUBLICATIONS

Italian Search Report issued by the Italian Patent Office in relation to Italian Patent Application No. 102015000087721 with English translation dated Aug. 29, 2016 (10 pages).

*Primary Examiner* — Marcus H Taningco
(74) *Attorney, Agent, or Firm* — Robert P. Michal, Esq.; Carter, DeLuca & Farrell LLP

(57) ABSTRACT

A semiconductor detector includes a plate-shaped semiconductor part, a signal output electrode for outputting a signal provided at one surface of the semiconductor part, a plurality of curved electrodes provided at the one surface of the semiconductor part and which have distances from the signal output electrode that are different from each other, and an arc-shaped collection electrode for collecting an electric charge generated at the semiconductor part. The plurality of curved electrodes are applied with voltage to generate in the semiconductor part a potential gradient in which a potential varies toward the signal output electrode. The collection electrode is located at a part of the semiconductor part between an adjacent pair of curved electrodes. The collection electrode is connected to a curved electrode located a distance from the signal output electrode shorter than a distance between the collection electrode and the signal output electrode among the curved electrodes.

15 Claims, 13 Drawing Sheets

(51) Int. Cl.
*H01L 31/08* (2006.01)
*G01R 29/08* (2006.01)
*H01L 31/115* (2006.01)
*G01T 1/29* (2006.01)

(52) U.S. Cl.
CPC .... *G01T 1/2928* (2013.01); *H01L 31/022408* (2013.01); *H01L 31/085* (2013.01); *H01L 31/115* (2013.01)

(56) References Cited

U.S. PATENT DOCUMENTS

| | | |
|---|---|---|
| 2005/0173733 A1 | 8/2005 | Struder et al. |
| 2010/0163740 A1* | 7/2010 | Matsuura ........ H01L 31/022408 250/370.13 |
| 2013/0341520 A1 | 12/2013 | Kostamo |
| 2013/0341752 A1* | 12/2013 | Kostamo ........... H01L 31/02005 257/490 |
| 2014/0124665 A1 | 5/2014 | Yasui et al. |
| 2014/0353786 A1* | 12/2014 | Andersson .......... H01L 31/0216 257/428 |

\* cited by examiner

F I G. 4
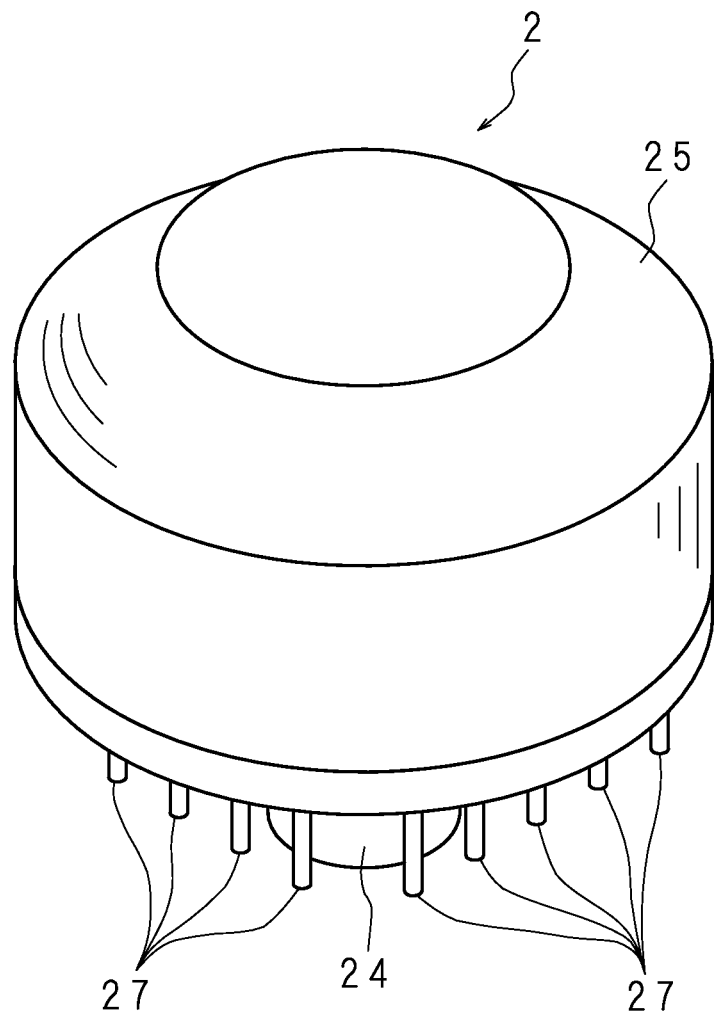

SEMICONDUCTOR DETECTOR, RADIATION DETECTOR AND RADIATION DETECTOR AND RADIATION DETECTION APPARATUS

CROSS-REFERENCE TO RELATED APPLICATION

This non-provisional application claims priority under 35 U.S.C. § 119(a) to Italian Patent Application No. 102015000087721 filed on Dec. 24, 2015, the entire contents of which are hereby incorporated by reference.

FIELD

The present invention relates to a semiconductor detector, a radiation detector and a radiation detection apparatus for detecting radiation.

BACKGROUND

An example of a radiation detector for detecting radiation such as X-ray includes a semiconductor detector using a semiconductor. A semiconductor detector often needs to be cooled by liquid nitrogen, while a silicon drift detector (SDD) may reduce noise without being cooled to the liquid nitrogen temperature. An interface between Si and $SiO_2$ is present around the surface of the semiconductor detector using silicon (Si), and electric charges irrelevant to electric charges derived from the entrance of radiation occurs at the interface. The occurrence of electric charges causes surface current, which may be a source of noise. Japanese Patent Application Laid-Open Publication No. 2014-2155 discloses a technique of collecting electric charges generated around the surface of an SDD. As an example, Japanese Patent Application Laid-Open Publication No. 2014-2155 discloses an SDD having a river structure in which a part of a ring-shaped electrode formed on a surface is made discontinuous in order to collect electric charges.

SUMMARY

The conventional semiconductor detector includes, on its surface, a bonding pad for flowing electric charges collected at the surface to the outside the semiconductor detector. By flowing the electric charges at the surface to the outside the semiconductor, surface current is reduced and thus noise is reduced. A problem remains, however, in that a bonding pad provided at the surface lowers the yield for production of the semiconductor detector due to a damage by bonding.

Moreover, in an SDD having the river structure disclosed in Japanese Patent Application Laid-Open Publication No. 2014-2155, the state of the interface between Si and $SiO_2$ varies depending on the production state of $SiO_2$, making it difficult to collect electric charges with high efficiency.

An aspect of the present disclosure has been made in view of the circumstances described above and aims to provide a semiconductor detector, a radiation detector and a radiation detection apparatus that prevent the configuration for reducing surface current from being a cause of lowering the yield.

A semiconductor detector according to an aspect of the present disclosure comprises a plate-shaped semiconductor part, a signal output electrode for outputting a signal which is provided at one surface of the semiconductor part, a plurality of curved electrodes which are provided at the one surface of the semiconductor part and which have distances from the signal output electrode that are different from each other, and an arc-shaped collection electrode for collecting an electric charge generated at the semiconductor part. The plurality of curved electrodes are applied with voltage so as to generate in the semiconductor part a potential gradient in which a potential varies toward the signal output electrode, and the collection electrode is located at a part of the semiconductor part located between an adjacent pair of curved electrodes.

The electric charges occurring at the surface of the semiconductor part are collected by the arc-shaped collection electrode, and thereby surface current is reduced.

In the semiconductor detector according to an aspect of the present disclosure, the collection electrode is connected to a curved electrode located with a distance from the signal output electrode shorter than a distance between the collection electrode and the signal output electrode.

The electric charges flowing at the surface of the semiconductor part are collected by the collection electrode due to the difference in potentials between the surface of the semiconductor part and the collection electrode. Furthermore, the configuration for applying a potential to a collection electrode may be simplified.

A semiconductor detector according to an aspect of the present disclosure comprises a plate-shaped semiconductor part, a signal output electrode for outputting a signal which is provided at one surface of the semiconductor part, a plurality of curved electrodes which are provided at the one surface of the semiconductor part and which have distances from the signal output electrode that are different from each other, and a non-ring-shaped collection electrode for collecting an electric charge generated at the semiconductor part. The plurality of curved electrodes are applied with voltage so as to generate in the semiconductor part a potential gradient in which a potential varies toward the signal output electrode, a plurality of the collection electrodes are located at a part of the semiconductor part located between an adjacent pair of curved electrodes, and each of the collection electrodes is connected to one of the curved electrodes located with a distance from the signal output electrode shorter than the distance between the signal output electrode and the collection electrode.

A plurality of collection electrodes are provided between an adjacent pair of curved electrodes. The charge generated at the surface of the semiconductor part is collected by the collection electrode, and surface current is reduced.

In the semiconductor detector according to an aspect of the present disclosure, the collection electrode is connected to a curved electrode located with a distance from the signal output electrode shorter than a distance between the pair of curved electrodes and the signal output electrode.

The potential of the curved electrode connected to the collection electrode is different from the potential of the surface of the semiconductor part at a position with which the collection electrode is located. The potential difference between the collection electrode and the surface of the semiconductor part is generated.

In the semiconductor detector according to an aspect of the present disclosure, the plurality of curved electrodes are applied with voltage so as to monotonically change a potential from a curved electrode distant from the signal output electrode to a curved electrode close to the signal output electrode.

The potential of the curved electrode is gradually increased or decreased, and the potential gradient is generated in the semiconductor part.

The semiconductor detector according to an aspect of the present disclosure further comprises a conductive part made of a conductive material, the conductive part having a part located on one curved electrode while being in contact with the curved electrode and another part connected to the collection electrode.

The collection electrode is connected to the curved electrodes and electric charges flow to the outside the semiconductor detector through a path used to apply the voltage to the curved electrodes.

A radiation detector according to an aspect of the present disclosure comprises the semiconductor detector according to the aspect of the present disclosure, a circuit board on which the semiconductor detector is mounted, and a base plate holding the semiconductor detector and the circuit board.

The structure of the semiconductor detector is simplified and the yield of the semiconductor detector is improved. Therefore, the cost for the radiation detection apparatus using the semiconductor detector is lowered.

A radiation detection apparatus according to an aspect of the present disclosure comprises the semiconductor detector according to the aspect of the present disclosure detecting radiation, an output part outputting a signal corresponding to energy of radiation detected by the semiconductor detector, and a spectrum generation part generating a spectrum of the radiation based on the signal output by the output part.

As the yield of the semiconductor detector is improved, the cost for the radiation detection apparatus using the semiconductor detector is lowered.

A radiation detection apparatus according to an aspect of the present disclosure detecting radiation generated from a sample irradiated with radiation comprises an irradiation part irradiating a sample with radiation, the semiconductor detector according to the aspect of the present disclosure detecting radiation generated from the sample, an output part outputting a signal corresponding to energy of radiation detected by the semiconductor detector, a spectrum generation part generating a spectrum of the radiation based on the signal output by the output part, and a display part displaying the spectrum generated by the spectrum generation part.

As the yield of the semiconductor detector is improved, the cost for the radiation detection apparatus using the semiconductor detector is lowered.

According to an aspect of the present disclosure, the electric charges collected by the collection electrode flow to the outside of the semiconductor detector through a path for applying voltage to the curved electrode. The configuration for reducing surface current caused at the surface of the semiconductor is simplified. Accordingly, the aspect of the present disclosure produces a beneficial effect such as improvement in the yield of the semiconductor detector and lowering in the cost for the radiation detection apparatus.

The above and further objects and features will more fully be apparent from the following detailed description with accompanying drawings.

BRIEF DESCRIPTION OF THE DRAWINGS

FIG. 4 is a schematic perspective view of a radiation detector including a semiconductor detector;

DETAILED DESCRIPTION

Embodiments of the present disclosure will be described below in detail with reference to the drawings illustrating the embodiments thereof.

Embodiment 1

Figure 1:
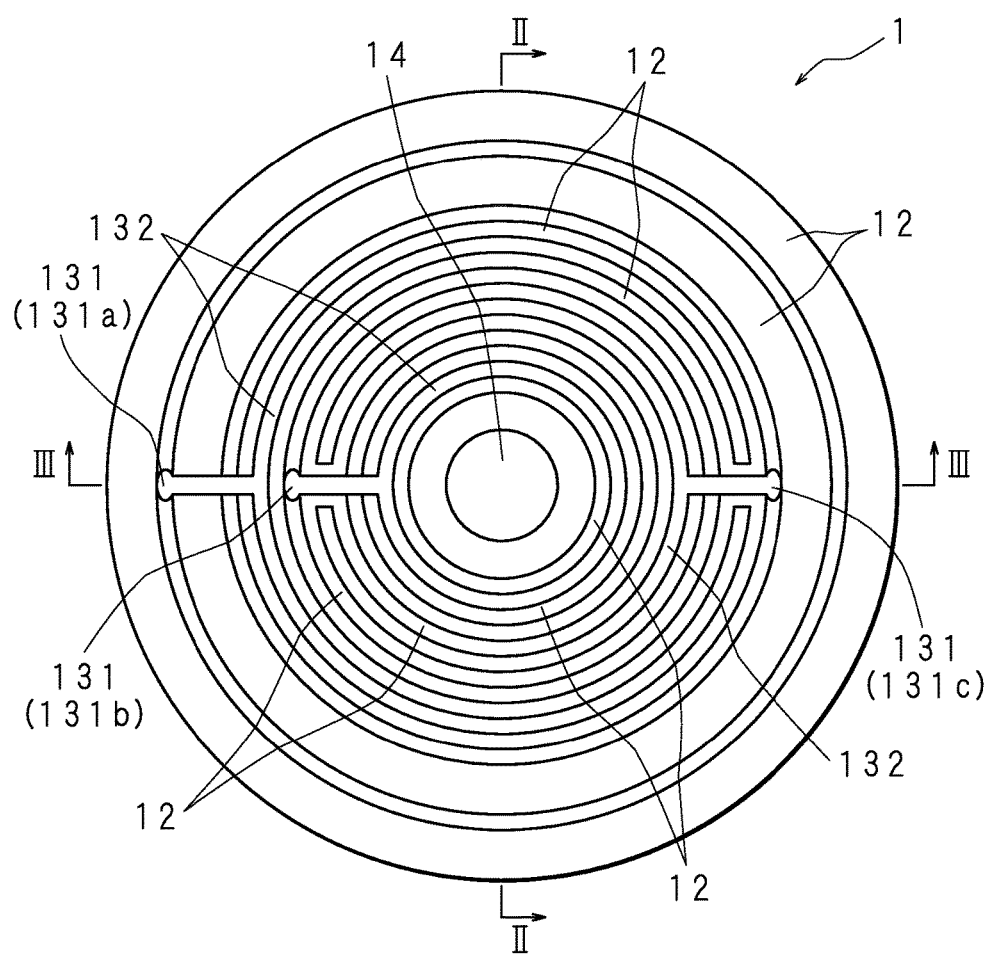
FIG. 1 is a schematic plan view of a semiconductor detector according to Embodiment 1.
Figure 2:
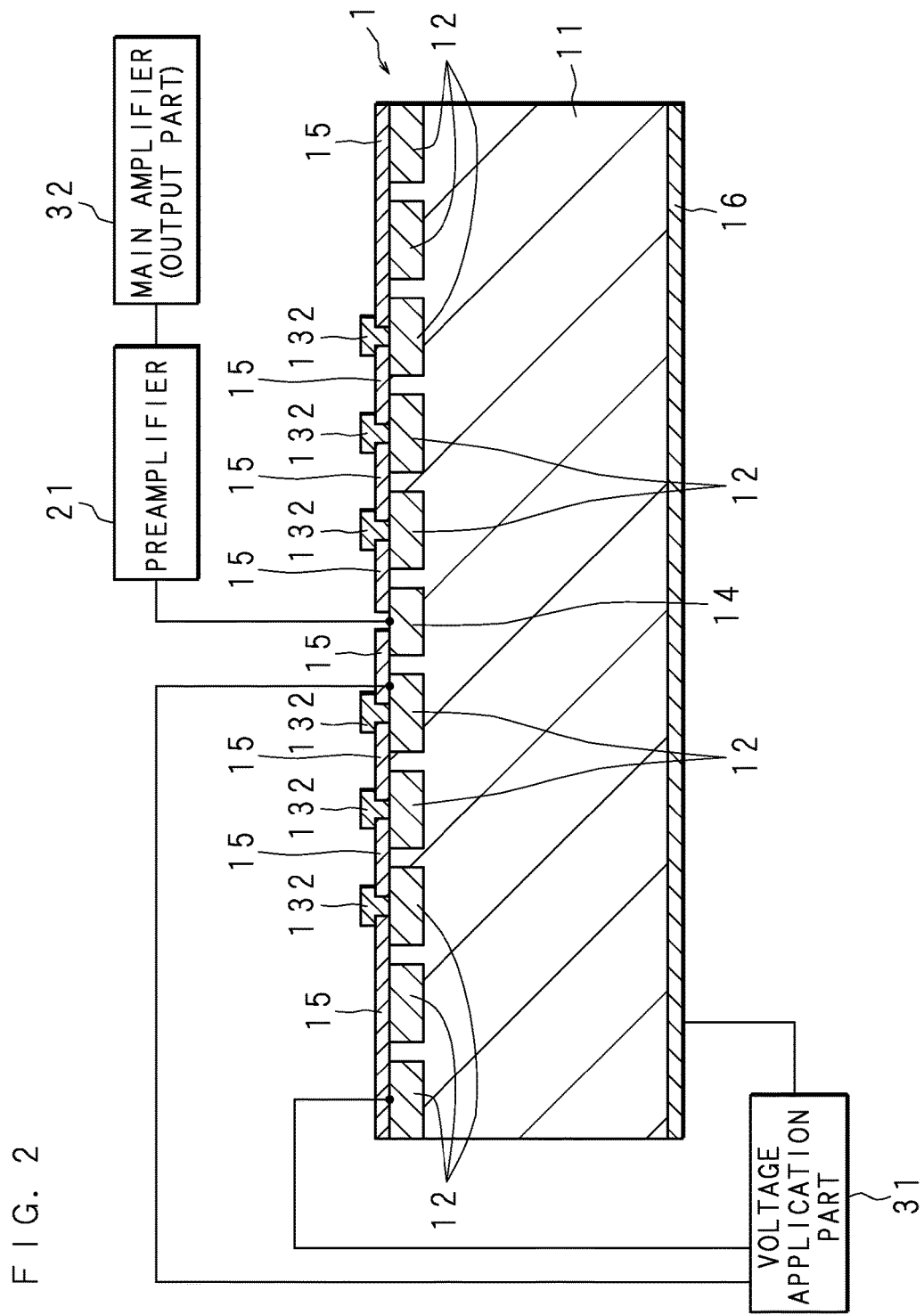
FIG. 2 is a block diagram illustrating a cross-section structure of the semiconductor detector taken along the line II-II in FIG. 1 as well as a manner of electrical connection for the semiconductor detector.
Figure 3:
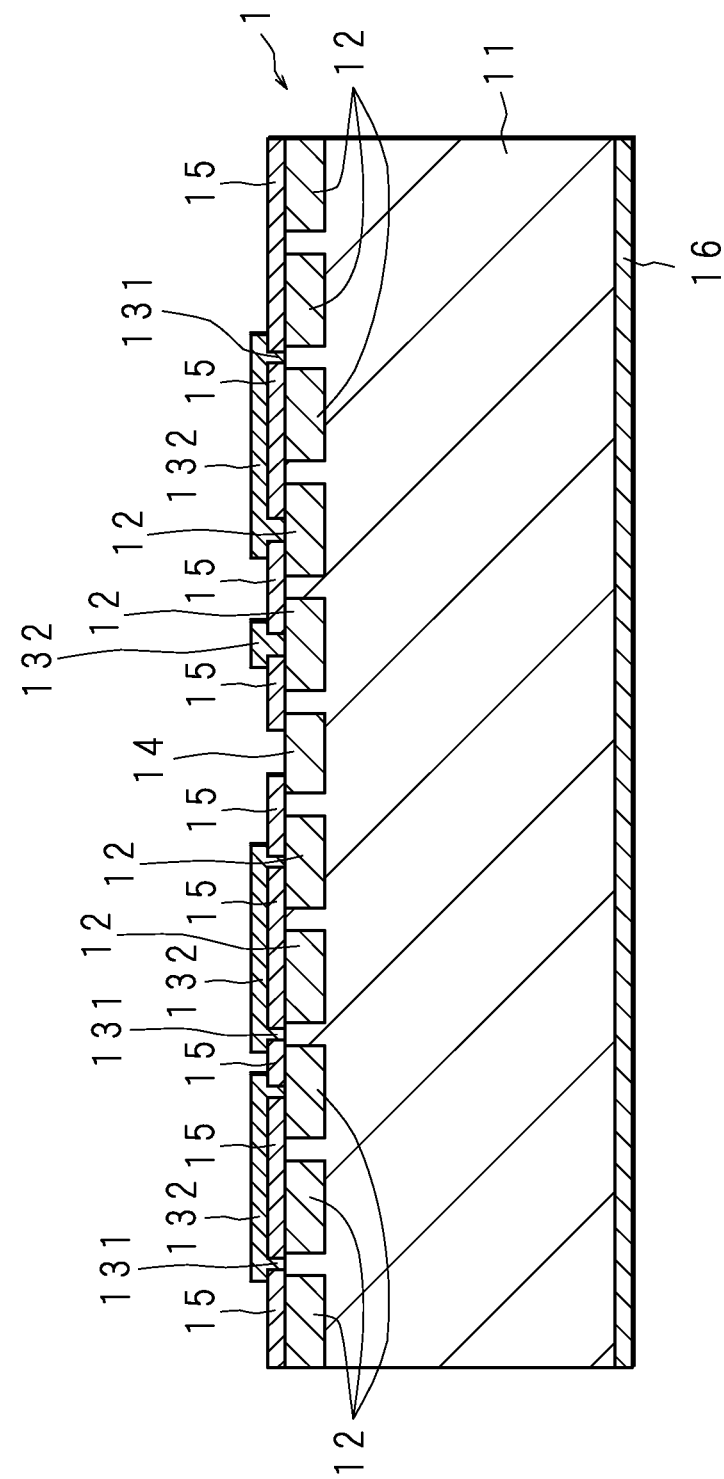
FIG. 3 is a schematic section view of the semiconductor detector taken along the line III-III in FIG. 1.

FIG. 1 is a schematic plan view of a semiconductor detector 1 according to Embodiment 1. FIG. 2 is a block diagram illustrating a cross-section structure of the semiconductor detector 1 taken along the line II-II in FIG. 1 as well as a manner of electrical connection for the semiconductor detector 1. FIG. 3 is a schematic section view of the semiconductor detector 1 taken along the line III-III in FIG. 1. The semiconductor detector 1 is an SDD. The semiconductor detector 1 includes a circular-disc-shaped Si layer 11 made of silicon (Si). The Si layer 11 is made of, for example, an n-type Si. The Si layer 11 corresponds to a semiconductor part. At the middle of one surface of the Si layer 11, a signal output electrode 14 is formed which serves as an electrode for outputting a signal at the time of detecting radiation. The constituent of the signal output electrode 14 is a same type Si as the Si layer 11, which is doped with a specific type of impurities such as phosphorus. Moreover, one surface of the Si layer 11 is provided with multiple ring-shaped electrodes (curved electrodes) 12. The ring-shaped electrode 12 is constituted by Si of a type different from that of the Si layer 11. For example, the constituent of the ring-shaped electrode 12 is p+Si in which Si is doped with a specific type of impurities such as boron. The ring-shaped electrodes 12 are located in contact with the Si layer 11. The multiple ring-shaped electrodes 12 are substantially concentric, while the signal output electrode 14 is located at the substantial center of the multiple ring-shaped electrodes 12. Though five ring-shaped electrodes 12 are illustrated in the drawing, a larger number of ring-shaped electrodes 12 are formed in practice. It is noted that the shape of each ring-shaped electrode 12 may be a deformed circular ring, and the multiple ring-shaped electrodes 12 are not necessarily concentric. Furthermore, the signal output electrode 14 may be located at a position other than the center of the multiple ring-shaped electrodes 12, and may be located at a position other than the middle of one surface of the Si layer 11. The shape of the semiconductor detector 1 may be a droplet shape. The shape of the Si layer 11 may be a shape other than circular-disc shape, and may be square shape, rectangular shape or trapezoidal shape, etc.

At the opposite surface of the Si layer 11, a rear electrode 16 serving as an electrode to which bias voltage is applied is formed on substantially the entire surface thereof. The rear electrode 16 is made of Si of a type different from that of the Si layer 11. For example, the constituent of the rear electrode 16 is p+Si, if that of the Si layer 11 is n-type Si. On the surface of the Si layer 11 where the signal output electrode 14 and the ring-shaped electrodes 12 are not formed, as well as on a part of the ring-shaped electrodes 12, the insulation film 15 is formed. The insulation film 15 is made of, for example, $SiO_2$. The insulation film 15 is not illustrated in FIG. 1. The rear electrode 16 is connected to the voltage application part 31. Moreover, the ring-shaped electrode 12 at the innermost side and the ring-shaped electrode 12 at the outermost side among the multiple ring-shaped electrodes 12 are connected to the voltage application part 31.

The voltage application part 31 applies voltage in such a manner that the potential at the innermost ring-shaped electrode 12 is highest whereas the potential at the outermost ring-shaped electrode 12 is lowest. Moreover, the semiconductor detector 1 is so configured that a predefined electric resistance occurs between adjacent ring-shaped electrodes 12. For example, a constituent of one portion of the Si layer 11 located between adjacent ring-shaped electrodes 12 is adjusted to form a resistive channel for connecting the two ring-shaped electrodes 12. That is, the multiple ring-shaped electrodes 12 are linked together through electric resistances. As voltage is applied to such ring-shaped electrodes 12 from the voltage application part 31, the ring-shaped electrodes 12 have potentials monotonically increasing in sequence from the ring-shaped electrode 12 at the outer side to the ring-shaped electrode 12 at the inner side. That is, the ring-shaped electrodes 12 have potentials increasing in sequence from the ring-shaped electrode 12 distant from the signal output electrode 14 toward the ring-shaped electrode 12 close to the signal output electrode 14. It is to be noted that an adjacent pair of ring-shaped electrodes 12 with the same potential may also be included in the multiple ring-shaped electrodes 12. The potentials of the ring-shaped electrodes 12 generate an electric field (a potential gradient) in which the potential is increased toward the signal output electrode 14 and the potential is decreased toward a position distant from the signal output electrode 14 in a stepwise manner. Furthermore, the voltage application part 31 applies voltage to the rear electrode 16 such that the potential at the rear electrode 16 is intermediate between the potential of the innermost ring-shaped electrode 12 and the potential of the outermost ring-shaped electrode 12. Accordingly, an electric field in which the potential is increased toward the signal output electrode 14 is generated inside the Si layer 11.

The signal output electrode 14 is connected to a preamplifier 21. A main amplifier 32 is connected to the preamplifier 21. The semiconductor detector 1 is formed in the shape of a circular disc as a whole, and is used while the surface on the side where the rear electrode 16 is formed serves as an entrance surface for incident radiation. The shape of the semiconductor detector 1 may be a shape other than circular disc shape. Radiation such as X-ray, photons in general (including UV and visible light), electron beam or other charged particle beam passes through the rear electrode 16 and enters inside the Si layer 11, which generates electric charges of an amount corresponding to the energy of radiation absorbed inside the Si layer 11. The generated electric charges are electrons and holes. The generated electric charges are moved by the electric field inside the Si layer 11, and one type is concentrated at the signal output electrode 14 while flowing therein. In the present embodiment, the electrons generated by the incident radiation move and flow into the signal output electrode 14, in the case the signal output electrode 14 is n-type. The electric charges flowed into the signal output electrode 14 are output as current signals and are input into the preamplifier 21. The preamplifier 21 converts the current signal into a voltage signal to be output to the main amplifier 32. The main amplifier 32 amplifies the voltage signal from the preamplifier 21, and outputs a signal with an amplitude corresponding to the energy of the incident radiation which entered the semiconductor detector 1. The main amplifier 32 corresponds to an output part in the present disclosure.

Figure 5:
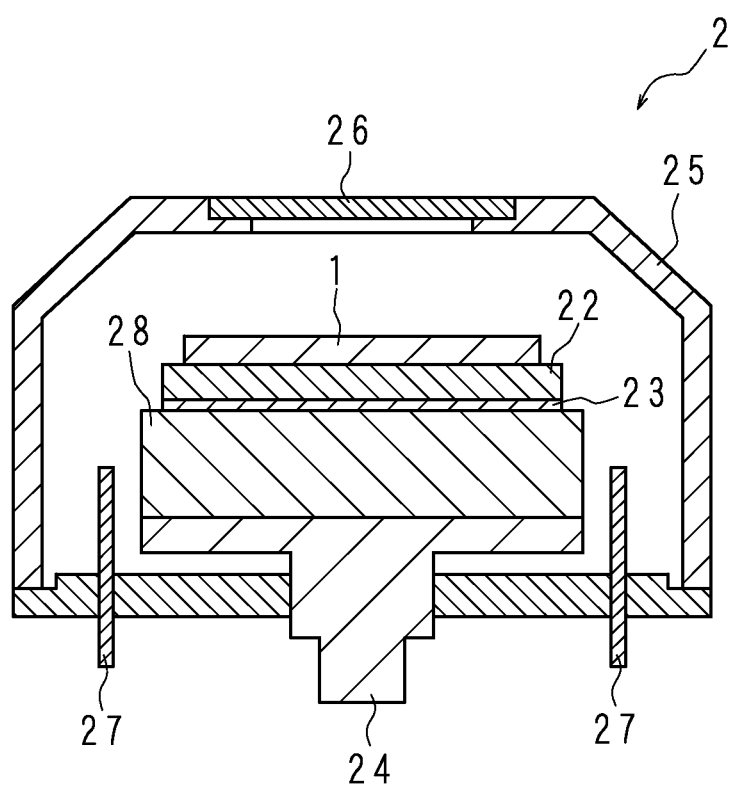
FIG. 5 is a schematic section view of the radiation detector.

FIG. 4 is a schematic perspective view of a radiation detector 2 including the semiconductor detector 1. FIG. 5 is a schematic section view of the radiation detector 2. The radiation detector 2 includes a housing 25 having a shape of a cylinder with one end thereof being connected to a truncated cone. At an end of the housing 25, a window 26 is formed which allows the passage of radiation. A semiconductor detector 1, a circuit board 22, a shielding plate 23, a cooling part 28 and a base plate 24 are arranged inside the housing 25. The base plate 24 is also referred to as a stem. The cooling part 28 is a Peltier device, for example. The semiconductor detector 1 is mounted to a surface of the circuit board 22 and is located at a position facing the window 26. A wiring is formed and the preamplifier 21 is mounted on the circuit board 22. The shielding plate 23 is interposed between the cooling part 28 and the circuit board 22, and is thermally in contact with a heat absorbing portion of the cooling part 28. The heat dissipating portion of the cooling part 28 is thermally in contact with the base plate 24.

The base plate 24 has a flat plate portion on which the cooling part 28 is mounted and fixed, as well as a portion penetrating the bottom part of the housing 25. By the circuit board 22 on which the semiconductor detector 1 is mounted being fixed to the cooling part 28 via the shielding plate 23 and the cooling part 28 being fixed to the base plate 24, the base plate 24 holds the semiconductor detector 1 and the circuit board 22. The shielding plate 23 is formed with a material for shielding X-ray. The shielding plate 23 shields X-ray, generated from the cooling part 28 or the base plate 24 when radiation enters the cooling part 28 or the base plate 24, so as to prevent it from entering the semiconductor detector 1. The heat from the semiconductor detector 1 is absorbed by the cooling part 28 through the circuit board 22 and the shielding plate 23, is transmitted from the cooling part 28 to the base plate 24, and is dissipated to the outside the radiation detector 2 through the base plate 24. The radiation detector 2 includes multiple lead pins 27 penetrating the bottom part of the housing 25. The lead pins 27 are connected to the circuit board 22 by a method such as wire bonding. Application of voltage to the semiconductor detector 1 by the voltage application part 31 and output of signals from the preamplifier 21 to the main amplifier 32 may be performed through the lead pins 27.

Figure 6:
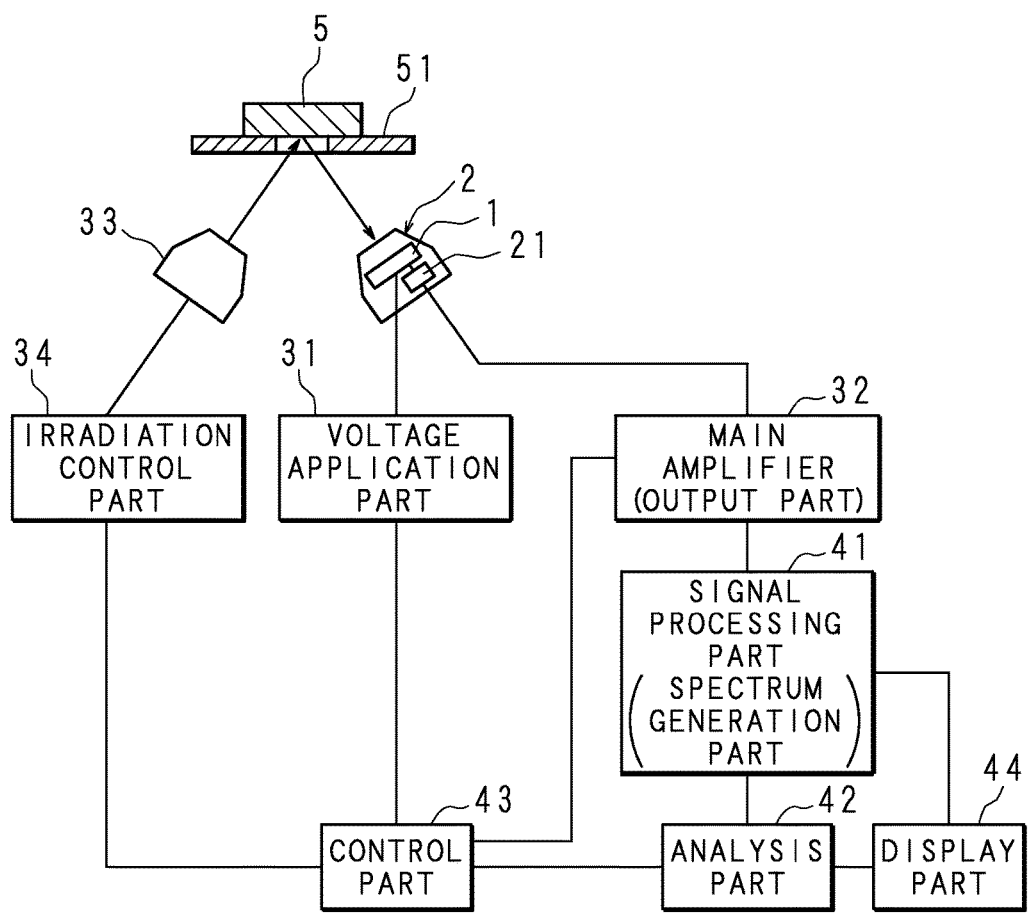
FIG. 6 is a block diagram illustrating a functional configuration of a radiation detection apparatus.

FIG. 6 is a block diagram illustrating a functional configuration of a radiation detection apparatus. The radiation detector 2 includes the semiconductor detector 1 and the preamplifier 21. The voltage application part 31 and the main amplifier 32 are located outside the radiation detector 2. The preamplifier 21 may partly be included in the radiation detector 2, whereas the other portions thereof may be located outside the radiation detector 2. The radiation detection apparatus includes a sample holding part 51 holding a sample 5, an irradiation part 33 irradiating the sample 5 with radiation such as X-ray, electron beam or particle beam and an irradiation control part 34 controlling the operation of the irradiation part 33. The irradiation part 33 irradiates the sample 5 with radiation, to generate radiation such as X-ray fluorescence at the sample 5. The radiation detector 2 is located at a position where the radiation generated from the sample 5 may enter the semiconductor detector 1. In the drawing, radiation is indicated by arrows. As described earlier, the main amplifier 32 outputs a signal corresponding to the energy of radiation detected by the semiconductor detector 1. The main amplifier 32 is connected to a signal processing part 41 for processing the output signals. The signal processing part 41 performs processing of counting each value of the signals output from the main amplifier 32 and generating the relationship between the energy of radiation and the counted number, i.e. a spectrum of radiation. The signal processing part 41 corresponds to a spectrum generation part in the present disclosure.

The signal processing part 41 is connected to an analysis part 42. The analysis part 42 is configured to include an operation part performing arithmetic operation and a memory in which data is stored. The signal processing part 41 outputs data indicating the generated spectrum to the analysis part 42. The analysis part 42 receives data input from the signal processing part 41, and performs processing of identifying an element contained in the sample 5 based on the spectrum indicated by the input data. The analysis part 42 may also perform processing of calculating the amount of various types of elements contained in the sample 5. The analysis part 42 is connected to a display part 44 such as a liquid-crystal display. The display part 44 displays a result of processing performed by the analysis part 42. Moreover, the display part 44 is connected to the signal processing part 41, and displays a spectrum generated by the signal processing part 41. Furthermore, the radiation detection apparatus includes a control part 43 controlling the operation of the entire apparatus. The control part 43 is connected to the voltage application part 31, the main amplifier 32, the irradiation control part 34 and the analysis part 42, to control the operation of the different parts. The control part 43 is constituted by a personal computer, for example. The control part 43 may be configured to accept the operation of the user, and to control the different parts of the radiation detection apparatus in accordance with the accepted operation. Moreover, the control part 43 and the analysis part 42 may be constituted by the same computer.

As illustrated in FIG. 1 to FIG. 3, in the present embodiment, an electrode 131 is formed in contact with a portion of the Si layer 11 located between an adjacent pair of ring-shaped electrodes 12. FIG. 1 illustrates an example where three electrodes 131, i.e. an electrode 131a, an electrode 131b and an electrode 131c, are formed. No insulation film 15 is provided at portions where the electrodes 131 are formed, while the electrodes 131 are in contact with the surface of the Si layer 11. In the case where the Si layer 11 is the n-type, the electrode 131 includes a region doped with impurities such as phosphorus. FIG. 1 and FIG. 3 illustrate an example where electrodes 131 are formed respectively in three gaps among the gaps of the ring-shaped electrodes 12. As illustrated in FIG. 1, the shape of each electrode 131 is a dot, not a ring, in plan view. Moreover, a conductive part 132 made of a conductive material is formed on a specific ring-shaped electrode 12. No insulation film 15 is provided at a part of a portion where the conductive part 132 is formed on the ring-shaped electrodes 12, while the conductive part 132 is in contact with the ring-shaped electrode 12. FIG. 1 to FIG. 3 illustrate an example where the conductive parts 132 are formed on three ring-shaped electrodes 12 respectively. Furthermore, a part of the conductive part 132 extends outward along one surface of the Si layer 11 and is connected to the electrode 131. That is, the electrode 131 is connected to the ring-shaped electrode 12 closer to the signal output electrode 14 through the conductive part 132. The distance between the ring-shaped electrode 12 connected to the electrode 131 and the signal output electrode 14 is shorter than the distance between the electrode 131 and the signal output electrode 14. In the example illustrated in FIG. 1 and FIG. 3, the electrode 131 is connected to the ring-shaped electrode 12 located in one inner side than the pair of ring-shaped electrodes 12 with a portion of the Si layer 11 which is in contact with the electrode 131 interposed in between. In this example, the distance between the ring-shaped electrode 12 connected to the electrode 131 and the signal output electrode 14 is shorter than the distance between the signal output electrode 14 and the pair of ring-shaped electrode 12 with the portion of the Si layer 11 interposed in between.

The potential at the surface of the Si layer 11 at a portion with which the electrode 131 is in contact is slightly positive with respect to the potential of the innermost ring-shaped electrodes 12 of the pair of ring-shaped electrodes 12 with the portion of the Si layer 11 interposed in between. As being connected to the ring-shaped electrode 12 closer to the signal output electrode 14 through the conductive part 132, the electrode 131 has the same potential as that of the ring-shaped electrode 12 closer to the signal output electrode 14. As such, the potential of the electrode 131 is made higher than the potential of the surface of the Si layer 11 at a position with which the electrode 131 is in contact. At the surface of the Si layer 11, electric charges are generated that are not derived from radiation entering the semiconductor detector 1 at the interface between Si and $SiO_2$. The generated electric charges are electrons and holes. The generated electric charges move along the surface of the Si layer 11 by the electric field inside the Si layer 11, causing surface current. Actually, holes are collected immediately by the ring-shaped electrodes 12, while electrons will flow to the electrodes 131 only if there is a conductive path to them. In the case where the electric charges that caused the surface current flows into the signal output electrode 14, a signal not derived by radiation is output from the signal output electrode 14, which causes noise. As the electrode 131 has a potential higher than that of the surface of the Si layer 11, the electrons generated at the surface of the Si layer 11 are collected by the electrode 131. This reduces surface current. The electrode 131 corresponds to a collection electrode in the present disclosure. Since the electrons collected at the electrode 131 will not flow into the signal output electrode 14, electrons not derived from radiation are suppressed from flowing into the signal output electrode 14.

Figure 7:
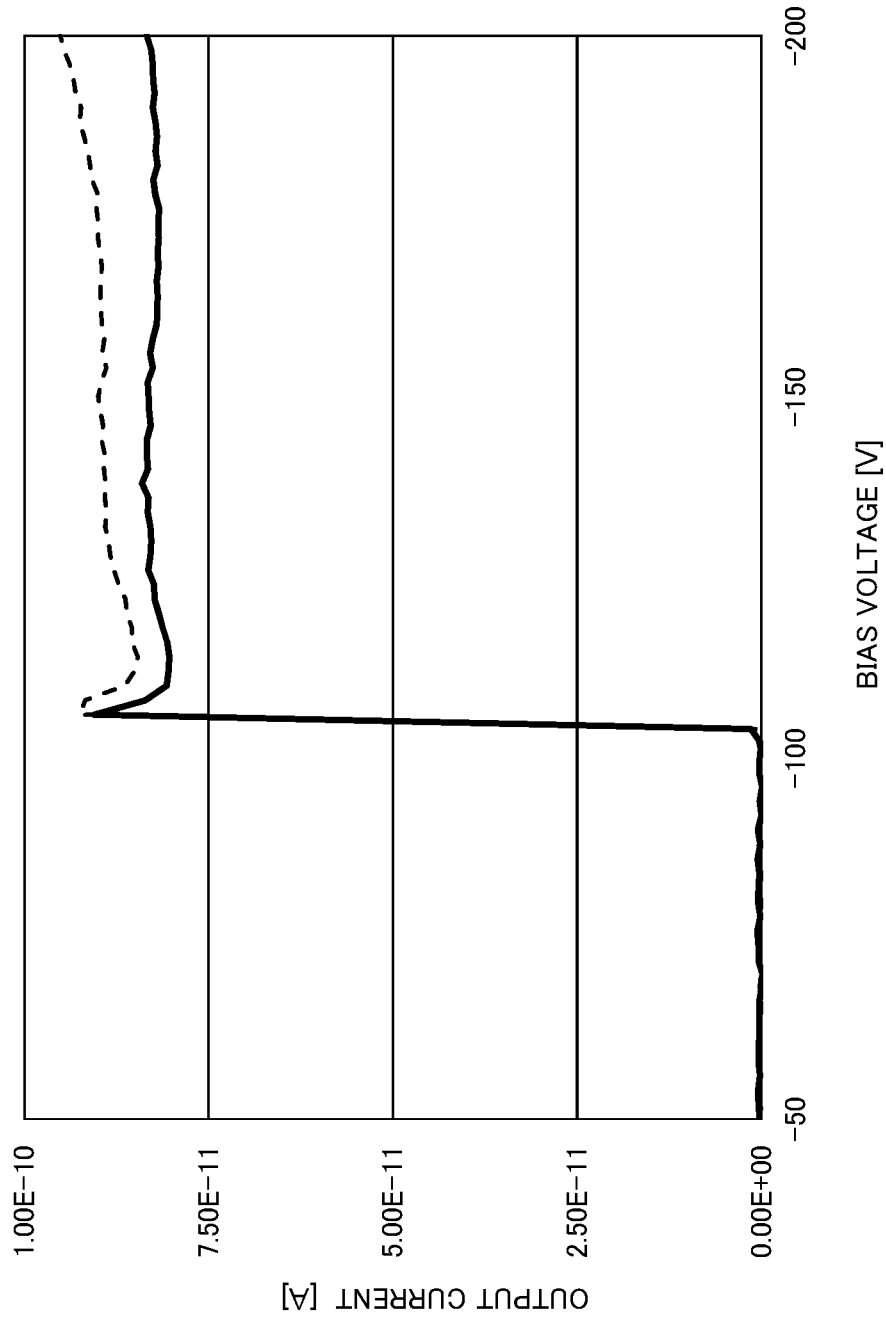
FIG. 7 is a characteristic view illustrating measurement results of current output from a signal output electrode.

An experiment was conducted to compare current output from the signal output electrode 14 between the semiconductor detector 1 according to the present embodiment and an SDD not provided with the electrode 131 and the conductive part 132. In the experiment, voltage was applied to the ring-shaped electrode 12 from the voltage application part 31, and current output from the signal output electrode 14 was measured in a state without incident radiation. FIG. 7 is a characteristic view illustrating measurement results of current output from the signal output electrode 14. The horizontal axis represents bias voltage applied to the ring-shaped electrode 12 farthest from the signal output electrode 14, whereas the vertical axis represents output current output from the signal output electrode 14. Furthermore, the measurement results of output current obtained from the semiconductor detector 1 according to the present embodiment are indicated by a solid line, while the measurement results of output current obtained from the SDD not provided with the electrode 131 and the conductive part 132 are indicated by the broken line.

The output current output from the signal output electrode 14 in the state without incident radiation includes current by electrons of the surface current flowed into the signal output electrode 14. As illustrated in FIG. 7, compared to the SDD not provided with the electrode 131 and the conductive part 132, output current is decreased in the semiconductor detector 1 according to the present embodiment. It is apparent that, because electrons are collected by the electrode 131 at the surface of the Si layer 11, the surface current is reduced and thus the electrons flowing into the signal output electrode 14 are decreased, resulting in the decreased output current. As a reduced number of electrons causing surface current flow into the signal output electrode 14, a signal not derived from radiation is suppressed from being output from the signal output electrode 14, which reduces noise. The reduction in noise improves the accuracy of detecting radiation.

Furthermore, as illustrated in FIG. 7, in the SDD not provided with the electrode 131 and the conductive part 132, output current is increased in accordance with the increase in the absolute value of the bias voltage. It was found that, in the SDD not provided with the electrode 131 and the conductive part 132, the rate of increase in the output current in accordance with the increase in the absolute value of the bias voltage is increased with the increase in the integrated value of the amount of X-ray irradiation. In view of this, it is estimated that, in the SDD not provided with the electrode 131 and the conductive part 132, surface current is increased by X-ray irradiation and aging progresses. In the semiconductor detector 1 according to the present embodiment has smaller output current as well as smaller rate of increase in the output current in accordance with the increase in the absolute value of bias voltage. This suppresses the increase in the surface current by X-ray irradiation, resulting in slower aging. Accordingly, the semiconductor detector 1 according to the present embodiment is suppressed from aging and has a longer life by collecting surface current at the electrode 131. With the semiconductor detector 1, the radiation detector 2 having a long lifetime and small noise included in an output signal may be obtained.

According to the present embodiment, as the electrode 131 is connected to the ring-shaped electrode 12 having a distance from the signal output electrode 14 shorter than the distance between the signal output electrode 14 and the ring-shaped electrode 12 closest to the electrode 131, the potential difference between the surface of the Si layer 11 and the electrode 131 is increased and electrons are efficiently collected. In particular, electrons, generated at a position between the pair of ring-shaped electrodes 12 with a portion of the Si layer 11 which is in contact with the electrode 131 interposed in between, are efficiently collected by the electrode 131. Furthermore, as the electrodes 131 are located at several portions, electrons generated at various parts at the surface of the Si layer 11 are collected by the electrodes 131 at several different portions, which efficiently reduces noise. Moreover, in the present embodiment, even if there is variation in the state of the semiconductor detector 1 which is difficult to control, for example the state of the interface between Si and $SiO_2$, electrons are efficiently collected because the distances between the generated electrons and the electrodes 131 are short.

Moreover, according to the present embodiment, each electrode 131 has a non-ring shape, which allows a portion not provided with the electrode 131 to be present between adjacent ring-shaped electrodes 12. In the case where the collection electrode has a ring shape, it is necessary to arrange a circuit outside the semiconductor detector in order to provide potential differences between the multiple ring-shaped electrodes, which increases the technical difficulty as well as cost. According to the present embodiment, each electrode 131 is a non-ring-shaped electrode, which makes it possible to easily produce a structure for providing potential differences between multiple ring-shaped electrodes 12 by, for example, forming an electric resistance within the semiconductor detector 1. For example, a resistive channel having an electric resistance is formed at a portion not provided with the electrode 131 which allows an electric resistance for connecting between adjacent ring-shaped electrodes 12 to be easily formed.

The electrons collected at the electrode 131 flow to the ring-shaped electrode 12 through the conductive part 132, and further flow to the voltage application part 31 from the ring-shaped electrode 12. This eliminates the need for a bonding pad for flowing the collected electrons to the outside the semiconductor detector 1. This simplifies the configuration for reducing surface current, preventing the yield for production of the semiconductor detector 1 from lowering due to the configuration for reducing surface current. This improves the yield of the semiconductor detector 1 and reduces the cost of the semiconductor detector 1. Accordingly, the cost is reduced for the radiation detector 2 including the semiconductor detector 1 as well as the radiation detection apparatus.

Embodiment 2

Figure 8:
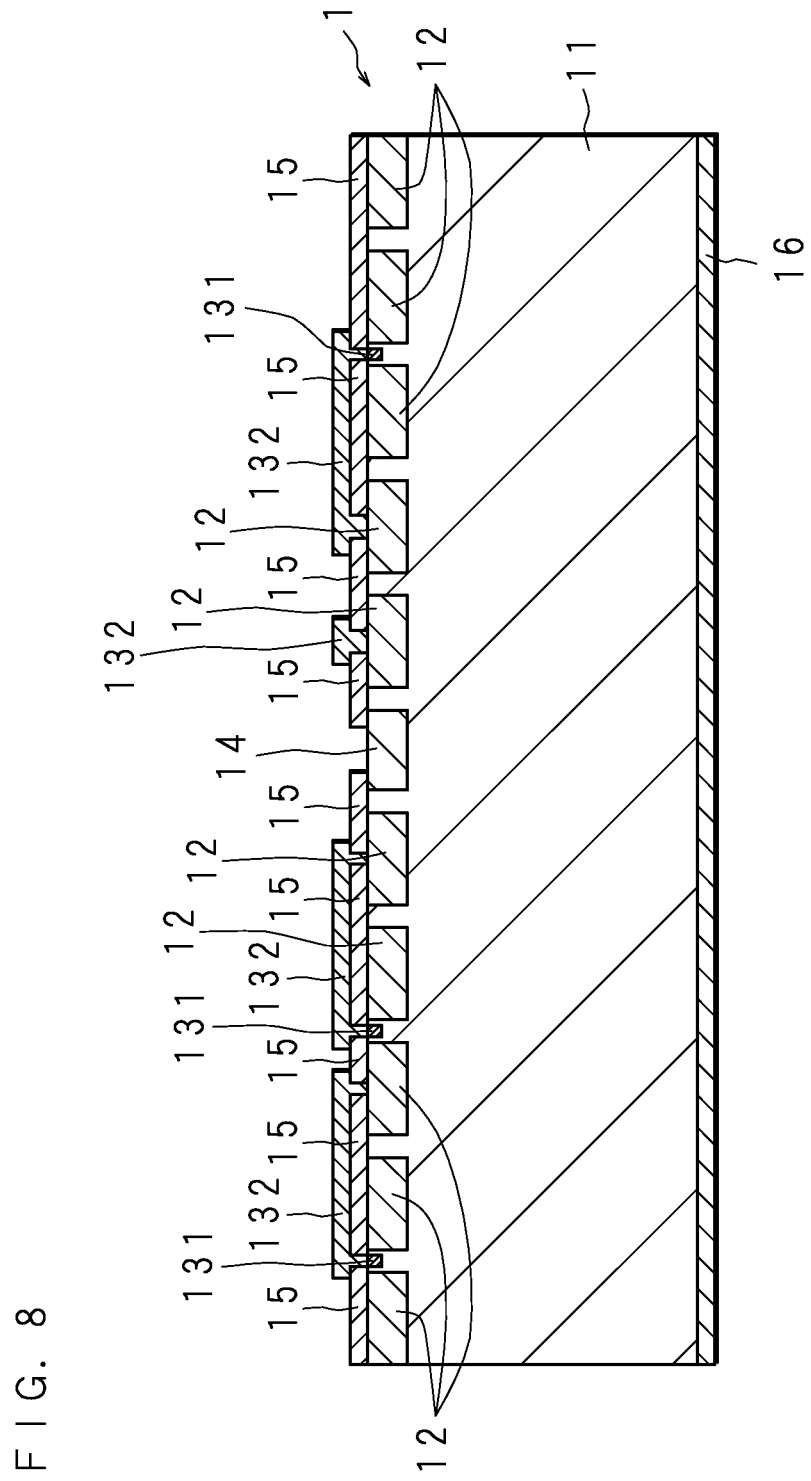
FIG. 8 is a schematic section view of a semiconductor detector according to Embodiment 2.

FIG. 8 is a schematic section view of the semiconductor detector 1 according to Embodiment 2. In the present embodiment, the electrode 131 is embedded in a portion of the Si layer 11 located between an adjacent pair of ring-shaped electrodes 12. The electrode 131 is connected to the conductive part 132. The other configuration parts of the semiconductor detector 1 are similar to those in Embodiment 1. Moreover, the configuration of the radiation detection apparatus including the semiconductor detector 1 is similar to that in Embodiment 1. The potential of the electrode 131 is higher than the potential of the Si layer 11 at the position where the electrode 131 is formed, but without electrode 131. Electrons not derived from radiation generated at the surface of the Si layer 11 are collected by the electrode 131. In the present embodiment, as the electrode 131 is embedded in the Si layer 11, electrons are more effectively collected at the electrode 131 compared to the case where the electrode 131 is merely in contact with the surface of the Si layer 11. The electrons not derived from radiation are effectively suppressed from flowing into the signal output electrode 14, thereby further reducing noise. Moreover, as in Embodiment 1, the need for a bonding pad for flowing the collected electrons to the outside the semiconductor detector 1 is eliminated, simplifying the configuration for reducing surface current. The yield of the semiconductor detector 1 is improved and thus the cost for the semiconductor detector 1 is lowered.

While Embodiments 1 and 2 illustrated a form where multiple electrodes 131 are linearly arranged, the electrodes 131 may also be arranged non-linearly. For example, in plan view, the electrodes 131a or 131b may also be arranged at a position where the line connecting the electrode 131a or 131b and the signal output electrode 14 forms an angle of approximately 90 degrees with respect to the line connecting the electrode 131c and the signal output electrode 14. Moreover, the electrodes 131a, 131b and 131c may be arranged at positions where the lines connecting the respective electrodes 131a, 131b and 131c to the signal output electrode 14 form an angle of approximately 120 degrees between each other. Moreover, the lines connecting the respective electrodes 131a, 131b and 131c to the signal output electrode 14 may form random angles between each other. Furthermore, while Embodiments 1 and 2 illustrated a form where one electrode 131 is formed at one portion of the Si layer 11 positioned between a pair of ring-shaped electrodes 12, multiple electrodes 131 may alternatively be formed at one portion of the Si layer 11 positioned between a pair of ring-shaped electrodes 12. In addition, multiple electrodes 131 may be connected to one ring-shaped electrode 12. Moreover, while Embodiments 1 and 2 illustrated an example where the electrode 131 is connected to a ring-shaped electrode 12 which is one closer to the inner side than the inner ring-shaped electrode 12 closest to the electrode 131, the electrode 131 may alternatively be connected to the ring-shaped electrode 12 closer to the signal output electrode 14. In such a case, the potential difference between the surface of the Si layer 11 and the electrode 131 is further increased.

Embodiment 3

Figure 9:
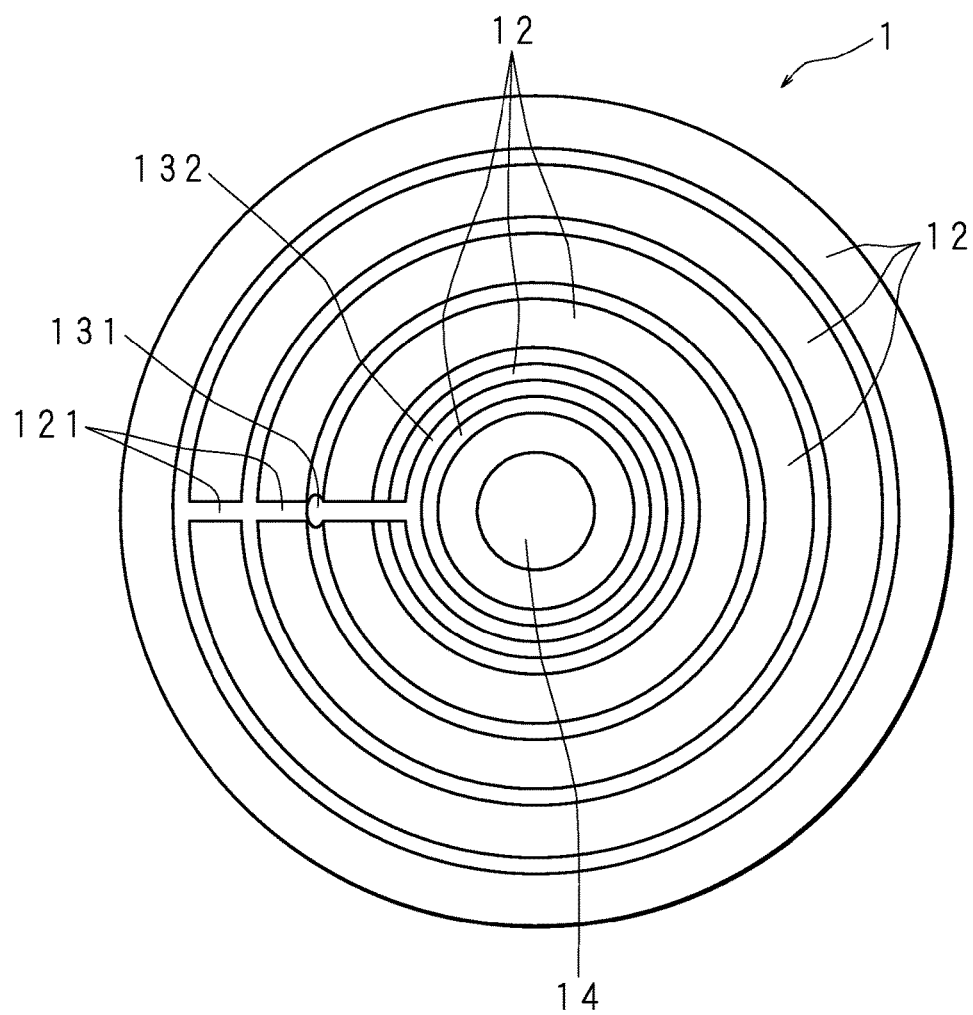
FIG. 9 is a schematic plan view of a semiconductor detector according to Embodiment 3.

FIG. 9 is a schematic plan view of the semiconductor detector 1 according to Embodiment 3. As in Embodiments 1 and 2, the signal output electrode 14 and multiple ring-shaped electrodes 12 are formed at one surface of the Si layer 11. An electrode 131 is formed in a portion of the Si layer 11 located between an adjacent pair of ring-shaped electrodes 12. On a specific ring-shaped electrode 12, a conductive part 132 is provided, the conductive part 132 being in contact with the ring-shaped electrode 12. As a part of the conductive part 132 extends outward and is connected to the electrode 131, the electrode 131 is connected to the ring-shaped electrode 12 located closer to the signal output electrode 14 via the conductive part 132. The ring-shaped electrodes 12 located at the outer side of the electrode 131 has a disconnected part in the circumferential direction. Although the ring-shaped electrodes 12 with disconnected parts do not have the shape of rings, they are referred to as the ring-shaped electrodes 12 here for the sake of convenience. A disconnected portion 121 having no ring-shaped electrode 12 is formed by dividing the ring-shaped electrode 12. The other configuration parts of the semiconductor detector 1 are similar to those of Embodiment 1 or 2. Furthermore, the configuration of the radiation detection apparatus including the semiconductor detector 1 is similar to that in Embodiments 1 and 2.

Similarly to Embodiments 1 and 2, the potential of the electrode 131 is higher than the potential of the Si layer 11 at the position where the electrode 131 is formed. At the surface of the Si layer 11, electrons not derived from incident radiation are generated, and the generated electrons are collected at the electrode 131. In particular, the electrons generated at a position between a pair of ring-shaped electrodes 12 with a portion of the Si layer 11 provided with the electrode 131 interposed in between are collected at the electrode 131. As in Embodiment 1, electrons not derived from radiation are suppressed from flowing into the signal output electrode 14, thereby reducing noise. Moreover, as in Embodiments 1 and 2, the need for a bonding pad for flowing the collected electrons to the outside the semiconductor detector 1 is eliminated, which simplifies the configuration for reducing surface current. This improves the yield of the semiconductor detector 1 and thus lowers the cost for the semiconductor detector 1.

According to the present embodiment, a part of the ring-shaped electrode 12 located at the outer side of the electrode 131 is disconnected, so that the electrons generated at the surface of the Si layer 11 located at the outer side of the electrode 131 pass through the disconnected portion 121, flow to the inner side where the potential is higher, and are collected at the electrode 131. Since the electrode 131 can collect the electrons generated at the outer side thereof, the efficiency of collecting electrons by one electrode 131 is improved. According to the present embodiment, therefore, the number of electrodes 131 may be reduced compared to Embodiments 1 and 2.

Embodiment 4

Figure 10:
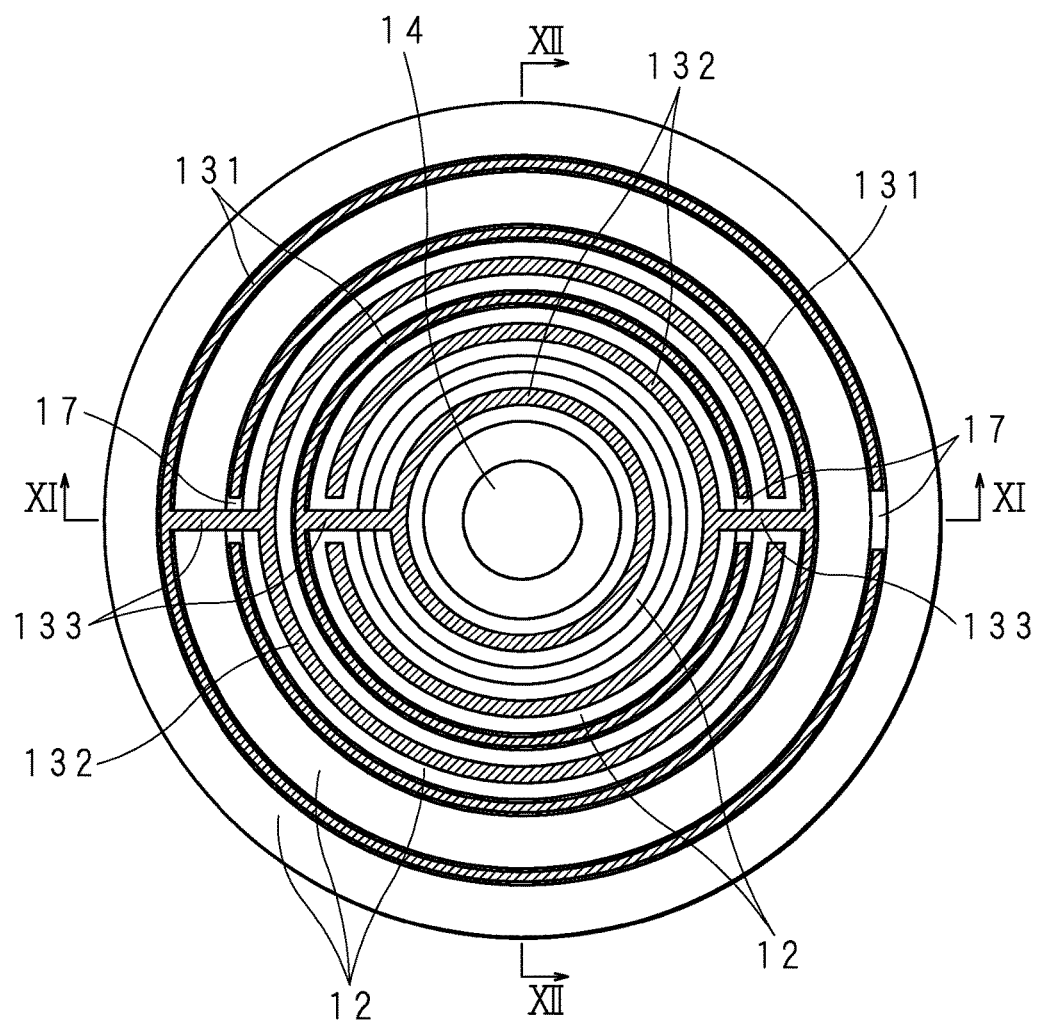
FIG. 10 is a schematic plan view of a semiconductor detector according to Embodiment 4.
Figure 11:
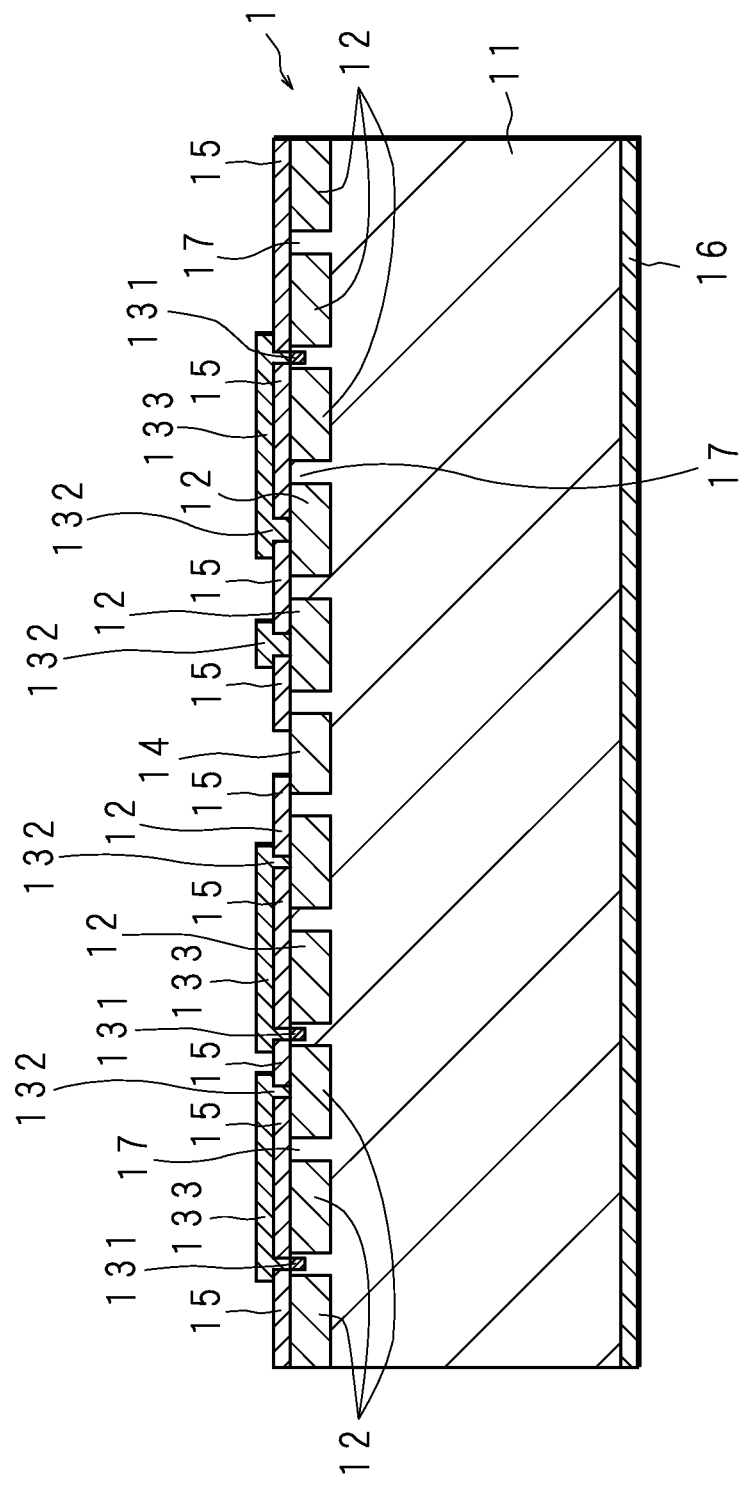
FIG. 11 is a schematic section view illustrating the semiconductor detector taken along the line XI-XI in FIG. 10.
Figure 12:
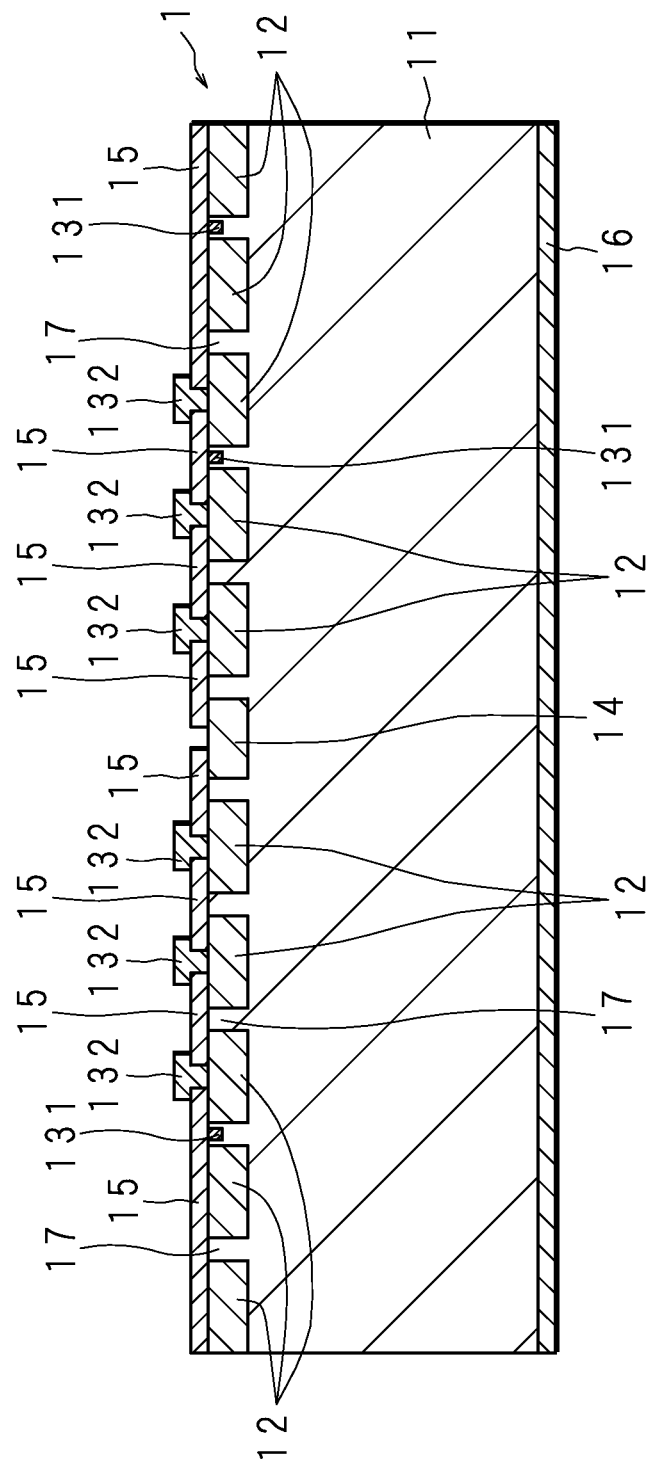
FIG. 12 is a schematic section view illustrating the semiconductor detector taken along the line XII-XII in FIG. 10.

FIG. 10 is a schematic plan view of a semiconductor detector 1 according to Embodiment 4. FIG. 11 is a schematic section view illustrating the semiconductor detector 1 taken along the line XI-XI in FIG. 10. FIG. 12 is a schematic section view illustrating the semiconductor detector 1 taken along the line XII-XII in FIG. 10. As in Embodiments 1 to 3, the signal output electrode 14 and the multiple ring-shaped electrodes 12 are formed on one surface of the Si layer 11. Electrodes 131 are embedded in a portion of the Si layer 11 located between an adjacent pair of ring-shaped electrodes 12. On specific ring-shaped electrodes 12, conductive parts 132 are formed, the conductive parts 132 being in contact with the respective ring-shaped electrodes 12. The conductive parts 132 are connected to extention parts 133 extending outward. The extention parts 133 are conductive. The extention parts 133 are connected to the electrodes 131. That is, each of the electrodes 131 is connected to the ring-shaped electrode 12 that are closer to the signal output electrode 14 via the extension part 133 and the conductive part 132. In FIG. 10, the electrodes 131, the conductive parts 132 and the extension parts 133 are hatched. As illustrated in FIG. 10, each of the conductive parts 132 has such a shape as not to overlap the extention part 133 connected to another one of the conductive parts 132 in plan view. As illustrated in FIGS. 11 and 12, an insulation film 15 is located between the extention part 133 and the Si layer as well as ring-shape electrode 12. The insulation film 15 is not illustrated in FIG. 10.

As illustrated in FIG. 10, each of the electrodes 131 has an arc shape in plan view. For example, the electrode 131 has such a shape that a part of a ring in the circumferential direction is disconnected in plan view. The portion of the Si layer 11 located between an adjacent pair of ring-shaped electrodes 12 includes a non-electrode part 17 where the electrode 131 is totally absent between a pair of ring-shaped electrodes 12. In the non-electrode part 17, for example, an electric resistance channel is provided which is connected between a pair of ring-shaped electrodes 12. The electric resistance channel may not necessarily be present at the non-electrode part 17. As illustrated in FIGS. 11 and 12, the electrode 131 is covered with the insulation film 15 except for the portion connected to the extension part 133. The other parts of the semiconductor detector 1 are configured similarly to those in Embodiment 1 or 2. Moreover, the radiation detection device provided with the semiconductor detector 1 is configured similarly to that in Embodiment 1 or 2.

As in Embodiments 1 to 3, the potential of the electrode 131 is higher than the potential of the Si layer 11 at the position where the electrode 131 is formed. The electrons not derived from the radiation generated at the surface of the Si layer 11 are collected by the electrode 131. As in Embodiments 1 to 3, the electrons not derived from the radiation are prevented from being flown into the signal output electrode 14, thereby reducing the noise. Moreover, similarly to Embodiments 1 to 3, the need for a bonding pad for flowing the collected electrons to the outside the semiconductor detector 1 is eliminated, thereby simplifying the configuration of reducing the surface current. This improves the yield of the semiconductor detector 1, and reduces the cost thereof.

In the present embodiment, since the electrode 131 has an arc-like shape, a larger number of portions of the Si layer 11 are in contact with the electrode 131 compared to the case that the electrode 131 has a dot-like shape. Thus, the electrons not derived from the radiation generated at the surface of the Si layer 11 are more reliably collected by the electrode 131. Furthermore, as the electrode 131 does not have a ring shape but an arc shape, the portion of the Si layer 11 located between an adjacent pair of ring-shaped electrodes 12 includes the non-electrode part 17. In the case where an electric resistance channel connected to the pair of ring-shaped electrodes 12 is formed at the non-electrode part 17, the electrode 131 will not overlap with the electric resistance channel. Cancellation of charges will not occur between the otherwise overlapping electrode 131 and the electrode resistance channel, so that the electrode 131 and the electric resistance channel function without affecting each other.

Embodiment 5

Figure 13:
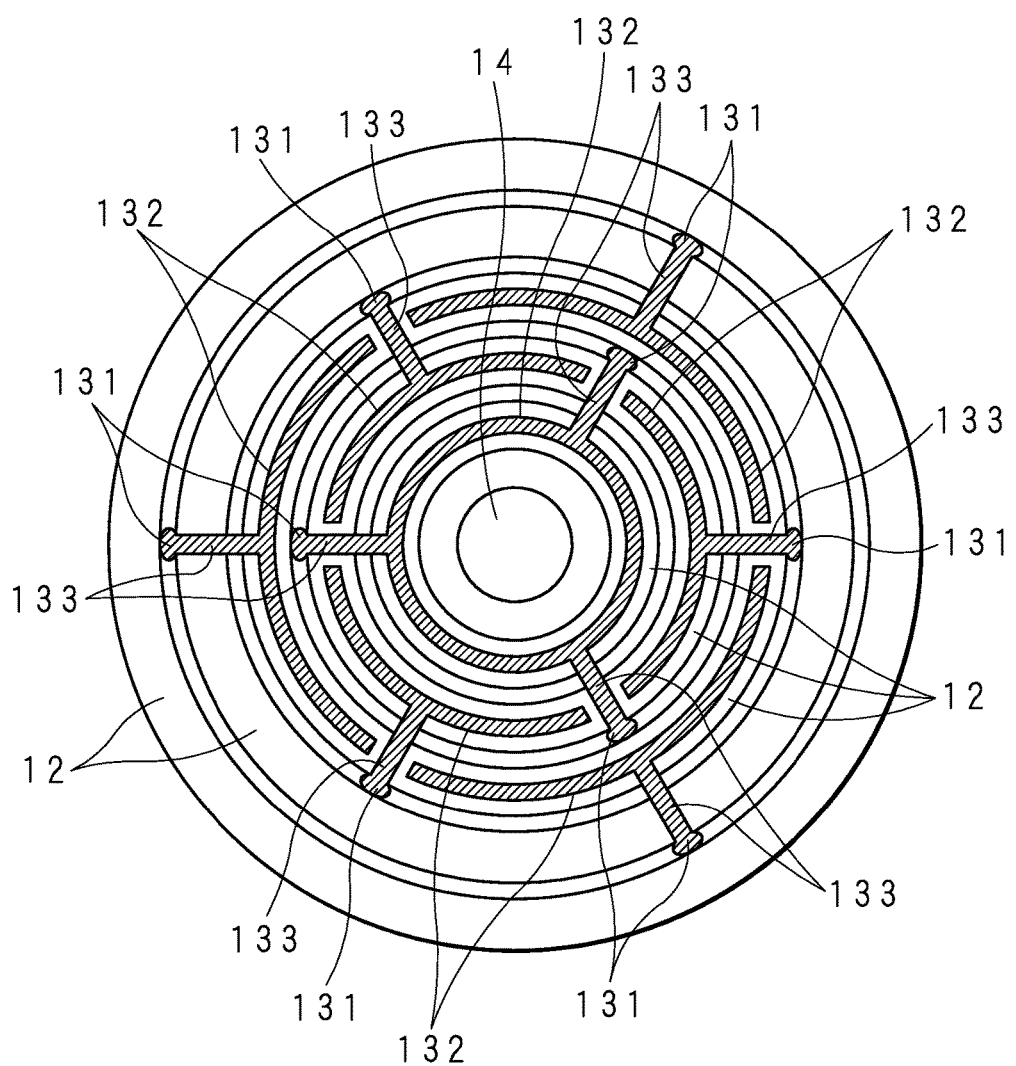
FIG. 13 is a schematic plan view of a semiconductor detector according to Embodiment 5.

FIG. 13 is a schematic plan view of a semiconductor detector 1 according to Embodiment 5. As in Embodiments 1 to 4, the signal output electrode 14 and multiple ring-shaped electrodes 12 are formed on one surface of the Si layer 11. A plurality of electrodes 131 are provided at a portion of the Si layer 11 located between an adjacent pair of ring-shaped electrodes 12. FIG. 13 illustrates an example where three electrodes 131 are located between an adjacent pair of ring-shaped electrodes 12. The number of electrodes 131 located between an adjacent pair of ring-shaped electrodes 12 may be two, or may be four or more. Each of the electrodes 131 has a dot-like shape in plan view. The electrode 131 may also have an arc-like shape in plan view.

The conductive part 132 is formed on and is in contact with a specific ring-shaped electrode 12. The conductive part 132 is connected to the extension part 133 extending outward. The extension part 133 is conductive. The electrodes 131 located between the respective adjacent pairs of ring-shaped electrodes 12 are connected to the extension parts 133 in one-to-one correspondence. That is, each electrode is individually connected to a ring-shaped electrode 12 closer to the signal output electrode 14 via the extension part 133 and the conductive part 132. The other configuration of the semiconductor detector 1 is similar to that in Embodiment 1 or 2. The insulation film 15 is not illustrated in FIG. 13. Furthermore, the radiation detection device comprising the semiconductor detector 1 is configured similarly to that in Embodiment 1 or 2.

As in Embodiments 1 to 4, the potential of the electrode 131 is higher than the potential of the Si layer 11 at the position where the electrode 131 is located. The electrons not derived from the radiation generated at the surface of the Si layer 11 are collected by the electrode 131. As in Embodiments 1 to 4, the electrons not derived from the radiation are prevented from being flown into the signal output electrode 14, which suppresses noise. Furthermore, as in Embodiments 1 to 4, the need for a bonding pad for flowing the collected electrons to the outside the semiconductor detector 1 is eliminated, thereby simplifying the configuration for reducing surface current. This improves the yield of the semiconductor detector 1 and reduces the cost thereof.

In the present embodiment, since a plurality of electrodes 131 are provided between the respective pairs of adjacent ring-shaped electrodes 12, electric charges are collected by the electrodes 131 at a larger number of positions compared to the case where only a single electrode 131 is employed. Thus, the electrons not derived from the radiation generated at the surface of the Si layer 11 are more reliably collected by the electrodes 131. In the form where each electrode 131 has an arc shape, a larger number of portions of Si layer 11 are in contact with the electrodes 131, and therefore the electrons not derived from the radiation generated at the surface of the Si layer 11 are more reliably collected by the electrodes 131.

While Embodiments 1 to 5 described above have illustrated examples in which the semiconductor part (Si layer 11) is made of an n-type semiconductor whereas the ring-shaped electrode 12 is made of a p-type semiconductor, the semiconductor detector 1 may alternatively have a form in which the semiconductor part is made of a p-type semiconductor whereas the ring-shaped electrode 12 is made of an n-type semiconductor. In addition, Embodiments 1 to 3 have mainly illustrated a form in which electrons generated by radiation are concentrated at and flow into the signal output electrode 14, the semiconductor detector 1 may also take a form in which holes generated by radiation are concentrated at and flow into the signal output electrode 14. In such a form, the voltage application part 31 applies voltage such that the potential monotonically decreases in sequence from the ring-shaped electrode 12 distant from the signal output electrode 14 to the ring-shaped electrode 12 close to the signal output electrode 14 and that the potential at the rear electrode 16 is intermediate between the potential of the innermost ring-shaped electrode 12 and the potential of the outermost ring-shaped electrode 12. At the surface of the Si layer 11, holes generated at the interface between Si and $SiO_2$ move toward the signal output electrode 14, causing surface current. The electrode 131 has a potential lower than that of the Si layer 11 at a position where the electrode 131 is formed, and thus collects holes.

Furthermore, while Embodiments 1 to 5 described above have illustrated that the curved electrodes are the multiple ring-shaped electrodes 12, the semiconductor detector 1 may also take a form of including curved electrodes each having a shape other than the ring shape. The curved electrodes have distances to the signal output electrodes 14 that are different from each other. The curved electrodes are applied with voltage from the voltage application part 31, present different potentials in sequence, and generate a potential gradient within the Si layer 11. For example, the shape of each curved electrode may be an arc shape.

In addition, the shape of the electrode 131 may be any non-ring shape other than a dot shape or an arc shape. Moreover, the semiconductor detector 1 may also take a form of collecting electric charges other than electrons or holes at the electrode 131. Furthermore, the radiation detection apparatus may also take a form of not being provided with the irradiation part 33 and detecting radiation entering from the outside.

It is to be noted that, as used herein and in the appended claims, the singular forms "a", "an", and "the" include plural referents unless the context clearly dictates otherwise.

It is to be noted that the disclosed embodiment is illustrative and not restrictive in all aspects. The scope of the present invention is defined by the appended claims rather than by the description preceding them, and all changes that fall within metes and bounds of the claims, or equivalence of such metes and bounds thereof are therefore intended to be embraced by the claims.

What is claimed is:

1. A semiconductor detector, comprising:
   a semiconductor part having a plate-shape;
   a signal output electrode for outputting a signal which is provided at one surface of the semiconductor part;
   a plurality of curved electrodes which are provided at the one surface of the semiconductor part and which have distances from the signal output electrode that are different from each other; and
   a collection electrode having an arcuate line shape and collecting an electric charge that is not derived from radiation and generated at the semiconductor part, wherein
   the plurality of curved electrodes are applied with voltage so as to generate in the semiconductor part a potential gradient in which a potential varies toward the signal output electrode,
   the collection electrode is located at a part of the semiconductor part located between an adjacent pair of curved electrodes,
   the collection electrode is embedded in the arcuate line shape in the part of the semiconductor part, and
   collected electric charges flow in the collection electrode.

2. The semiconductor detector according to claim 1, wherein the collection electrode is connected to a curved electrode located with a distance from the signal output electrode shorter than a distance between the collection electrode and the signal output electrode.

3. The semiconductor detector according to claim 1, wherein the collection electrode is connected to a curved electrode located with a distance from the signal output electrode shorter than a distance between the pair of curved electrodes and the signal output electrode.

4. The semiconductor detector according to claim 1, wherein the plurality of curved electrodes are applied with voltage so as to monotonically change a potential from a curved electrode distant from the signal output electrode to a curved electrode close to the signal output electrode.

5. The semiconductor detector according to claim 1, further comprising a conductive part made of a conductive material, the conductive part having a part located on one curved electrode while being in contact with the curved electrode and another part connected to the collection electrode.

6. A radiation detector, comprising:
   the semiconductor detector according to claim 1;
   a circuit board on which the semiconductor detector is mounted; and
   a base plate holding the semiconductor detector and the circuit board.

7. A radiation detection apparatus, comprising:
   the semiconductor detector according to claim 1 detecting radiation;
   an output part outputting a signal corresponding to energy of radiation detected by the semiconductor detector; and
   a spectrum generation part generating a spectrum of the radiation based on the signal output by the output part.

8. A radiation detection apparatus detecting radiation generated from a sample irradiated with radiation, comprising:
   an irradiation part irradiating a sample with radiation;
   the semiconductor detector according to claim 1 detecting radiation generated from the sample;
   an output part outputting a signal corresponding to energy of radiation detected by the semiconductor detector;
   a spectrum generation part generating a spectrum of the radiation based on the signal output by the output part; and
   a display part displaying the spectrum generated by the spectrum generation part.

9. A semiconductor detector, comprising:
   a plate-shaped semiconductor part:
   a signal output electrode for outputting a signal which is provided at one surface of the semiconductor part;
   a plurality of curved electrodes which are provided at the one surface of the semiconductor part and which have distances from the signal output electrode that are different from each other; and
   a non-ring-shaped collection electrode having an arcuate line shape and collecting an electric charge that is not derived from radiation and generated at the semiconductor part,
   wherein the plurality of curved electrodes are applied with voltage so as to generate in the semiconductor part a potential gradient in which a potential varies toward the signal output electrode,
   a plurality of the collection electrodes are located at a part of the semiconductor part located between an adjacent pair of curved electrodes,
   each of the plurality of collection electrodes is embedded in the arcuate line shape in the part of the semiconductor part,
   collected electric charges flow in the collection electrode, and
   each of the plurality of collection electrodes is connected to one of the curved electrodes with a distance from the signal output electrode shorter than a distance between the signal output electrode and the collection electrode.

10. The semiconductor detector according to claim 9, wherein the collection electrode is connected to a curved electrode located with a distance from the signal output electrode shorter than a distance between the pair of curved electrodes and the signal output electrode.

11. The semiconductor detector according to claim 9, wherein the plurality of curved electrodes are applied with voltage so as to monotonically change a potential from a curved electrode distant from the signal output electrode to a curved electrode close to the signal output electrode.

12. The semiconductor detector according to claim 9, further comprising a conductive part made of a conductive material, the conductive part having a part located on one curved electrode while being in contact with the curved electrode and another part connected to the collection electrode.

13. A radiation detector, comprising:
   the semiconductor detector according to claim 9;
   a circuit board on which the semiconductor detector is mounted; and
   a base plate holding the semiconductor detector and the circuit board.

14. A radiation detection apparatus, comprising:
   the semiconductor detector according to claim 9 detecting radiation;
   an output part outputting a signal corresponding to energy of radiation detected by the semiconductor detector; and
   a spectrum generation part generating a spectrum of the radiation based on the signal output by the output part.

15. A radiation detection apparatus detecting radiation generated from a sample irradiated with radiation, comprising:
   an irradiation part irradiating a sample with radiation;
   the semiconductor detector according to claim 9 detecting radiation generated from the sample;
   an output part outputting a signal corresponding to energy of radiation detected by the semiconductor detector;
   a spectrum generation part generating a spectrum of the radiation based on the signal output by the output part; and
   a display part displaying the spectrum generated by the spectrum generation part.

* * * * *